United States Patent [19]

Uya

[11] Patent Number: 4,884,143
[45] Date of Patent: Nov. 28, 1989

[54] LAMINATION TYPE SOLID IMAGE PICK UP APPARATUS FOR AVOIDING A NARROW CHANNEL EFFECT

[75] Inventor: Shinji Uya, Kawasaki, Japan

[73] Assignee: Kabushiki Kaisha Toshiba, Kawasaki, Japan

[21] Appl. No.: 248,975

[22] Filed: Sep. 26, 1988

[30] Foreign Application Priority Data

Sep. 29, 1987 [JP] Japan .................. 62-245404

[51] Int. Cl.$^4$ ............................................. H04N 3/14
[52] U.S. Cl. .............................. 358/213.28; 357/24; 358/213.29; 250/211.3
[58] Field of Search ................. 358/213.26, 213.28, 358/213.29; 250/211 J, 578; 357/24 LR

[56] References Cited

U.S. PATENT DOCUMENTS

| | | | |
|---|---|---|---|
| 4,012,587 | 3/1977 | Ochi et al. | 250/211 J |
| 4,081,841 | 3/1978 | Ochi et al. | 358/213.26 |
| 4,336,556 | 2/1982 | Sekine et al. | 250/211 J |
| 4,602,289 | 7/1986 | Sekine | 358/213.29 |

*Primary Examiner*—Jin F. Ng
*Assistant Examiner*—Stephen Brinich
*Attorney, Agent, or Firm*—Oblon, Spivak, McClelland, Maier & Neustadt

[57] ABSTRACT

A solid state image pickup apparatus is of a laminated type, and charge reading source layers 4 for the individual pixels, which are adjacent to buried channels 3 of vertical CCDs, are formed in such a pattern that the arrays of horizontally adjoining source layers are shifted by a ½ pixel pitch from one another in the vertical direction. The buried channels are formed in a zig-zag pattern with a nearly constant channel width.

3 Claims, 14 Drawing Sheets

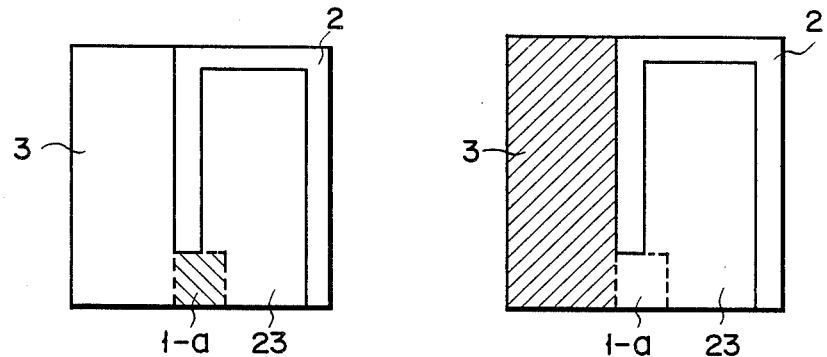
F I G. 2A     F I G. 2B
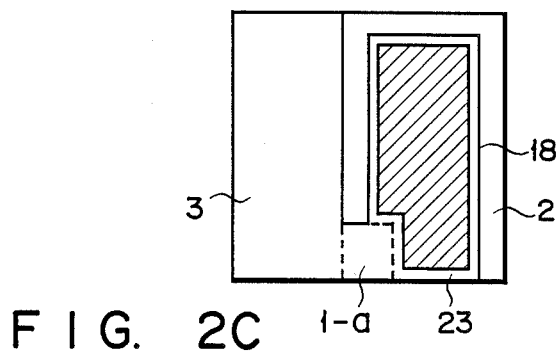
F I G. 2C

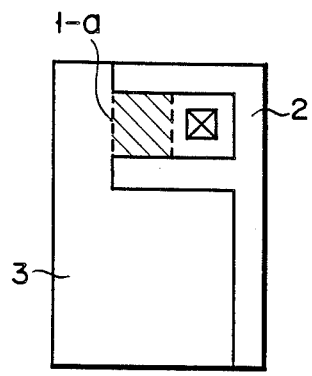 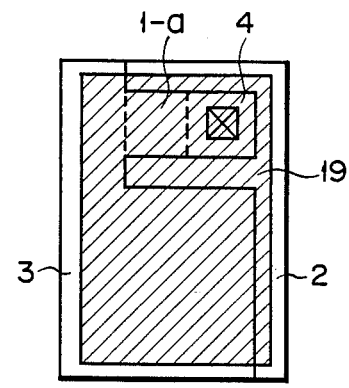
F I G. 7A   F I G. 7B
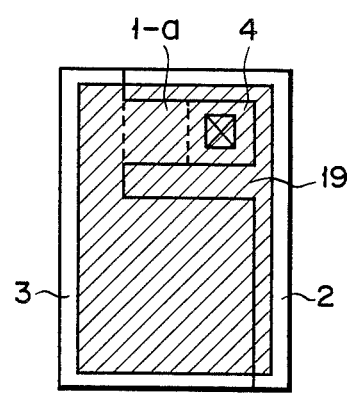
F I G. 7C

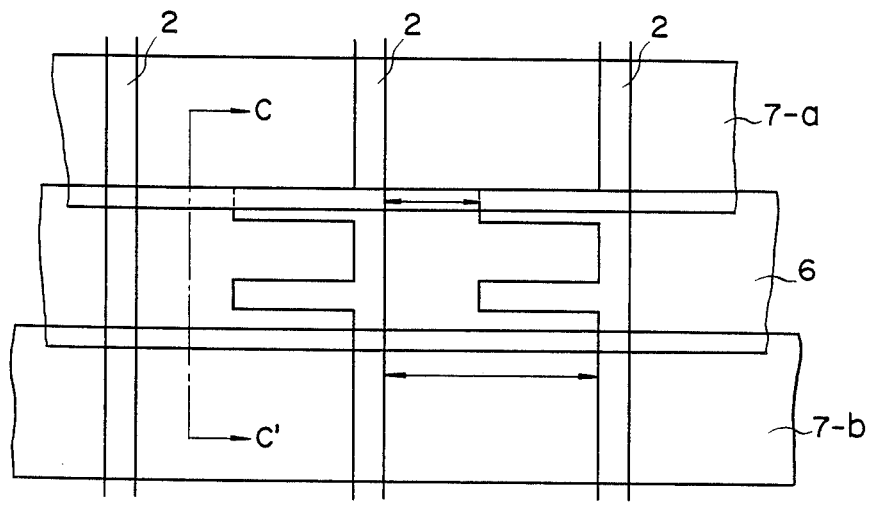
F I G. 14
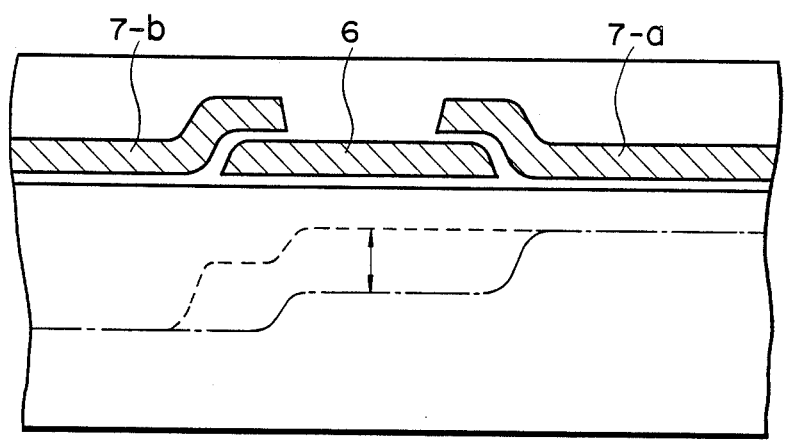
F I G. 15

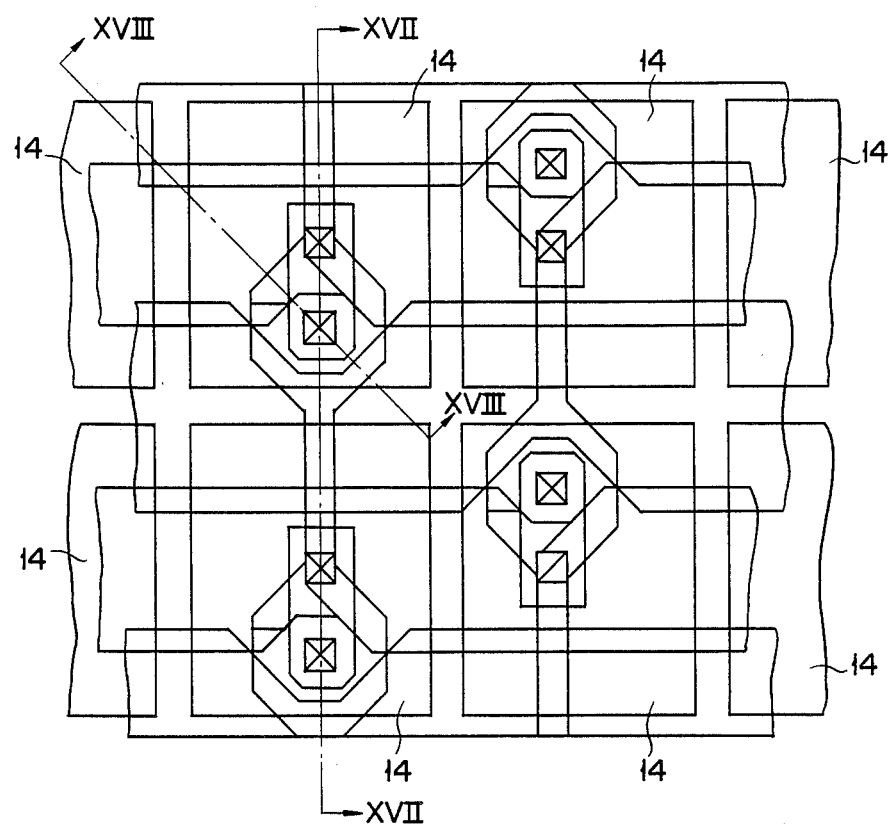
F I G. 16

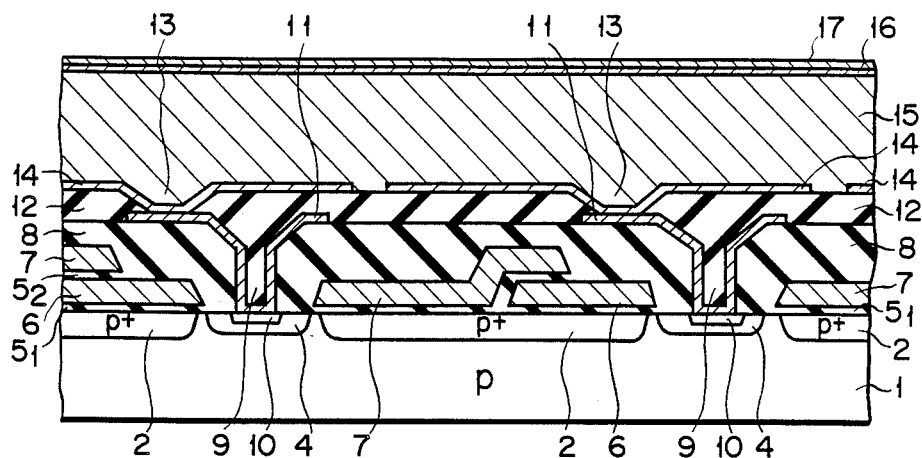
F I G. 17
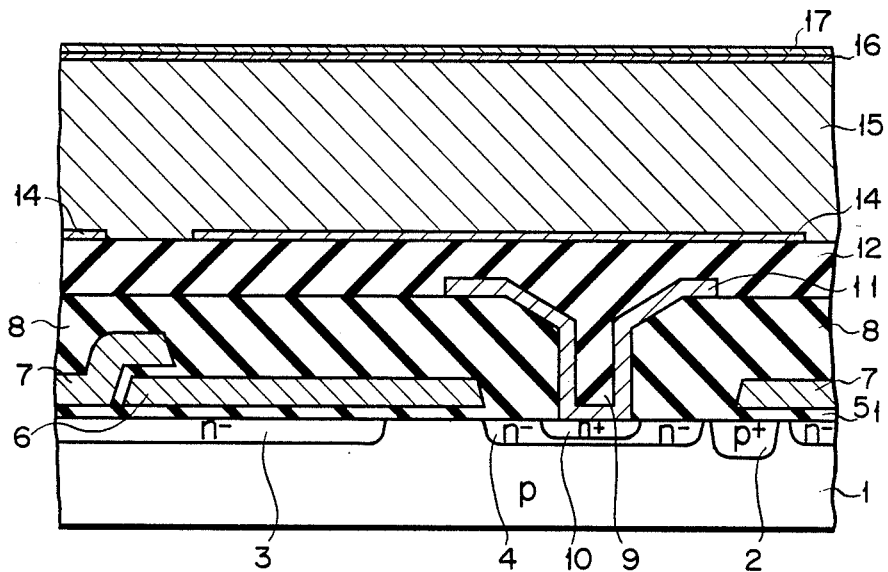
F I G. 18

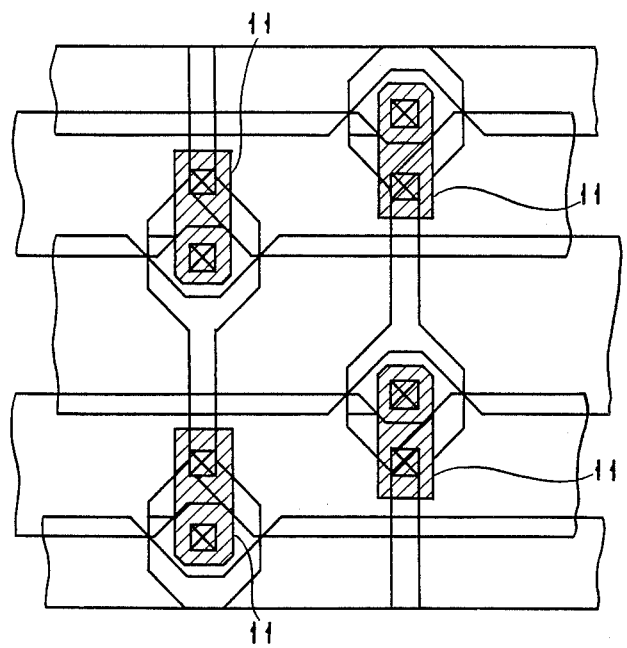
F I G. 23
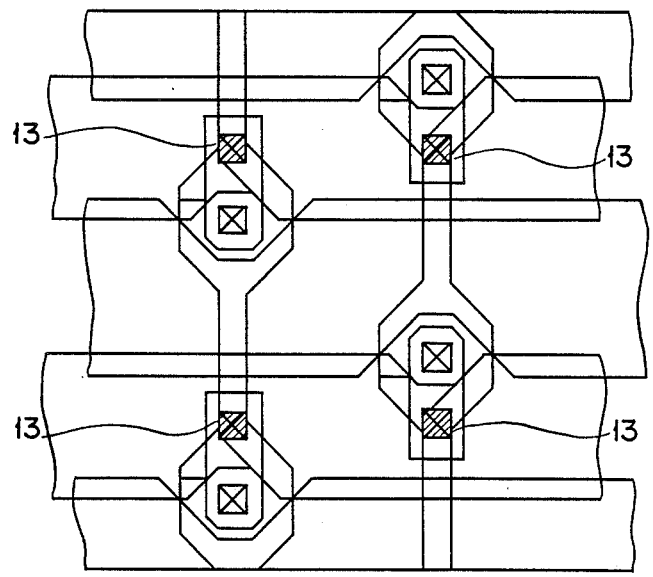
F I G. 24

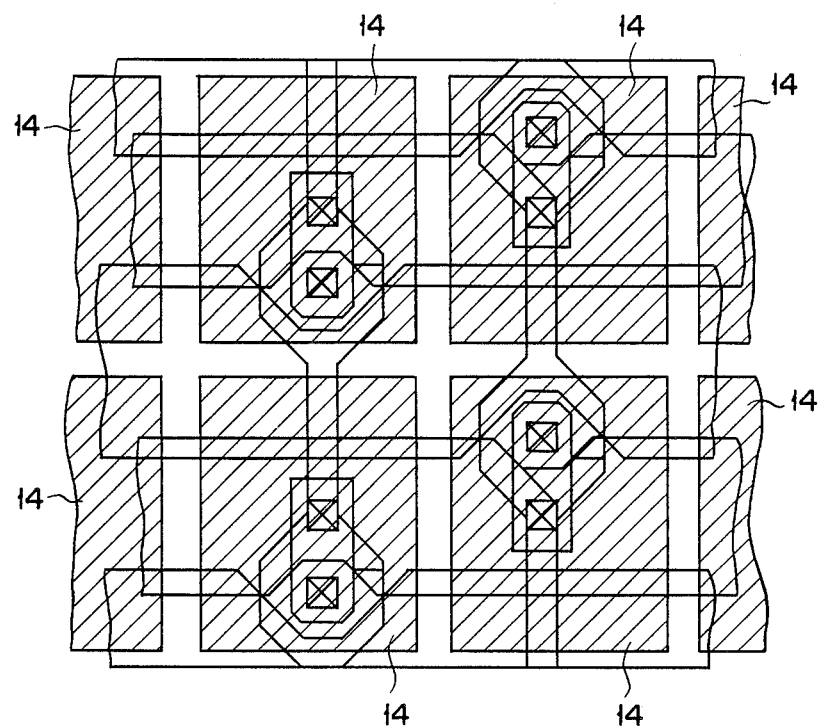
F I G. 25

IMPROVED LAMINATION TYPE SOLID IMAGE PICK UP APPARATUS FOR AVOIDING A NARROW CHANNEL EFFECT

BACKGROUND OF THE INVENTION

1. Field of the Invention

The present invention relates to an improvement of a solid state image pickup apparatus having a photoconductive film as a photoelectric converting section formed on a CCD scan substrate.

2. Description of the Related Art

The essential section of a monolithic type CCD image pickup apparatus generally has the structure as shown in FIG. 1. Numeral 3 is an n-type buried channel on which transfer gates 6 and 7 are formed respectively through gate insulation films $5_1$ and $5_2$, thus constituting a vertical CCD. A photodiode 23 serving as a photoelectric converting section for the individual pixels is disposed adjacent to the vertical CCD. Numeral 2 is a p-type channel stopper. The pattern for one pixel portion of this CCD image pickup apparatus is as illustrated in FIGS. 2A-2C. FIG. 2A illustrates a signal charge transfer section 1-a between photodiode 23 and buried channel 3 as a shaded region, FIG. 2B buried channel 3 as a shaded region, and FIG. 2C an opening 18 of the photoelectric converting section constituted by photodiode 23, as a shaded region. As should be understood from these diagrams, since the monolithic type CCD image pickup apparatus has both of buried channel 3 and photodiode 23 formed on the same semiconductor substrate, the area of opening 18 is small. To reduce the lateral size of a pixel cell, therefore, the width of buried channel 3 decreases and so does the area of photodiode 23, as shown in FIGS. 3A-3C. This results in reduction in sensitivity of the image pickup apparatus and reduction in signal charge transfer capacity.

In contrast, a solid state image pickup apparatus having a photoconductive film formed on a CCD scan substrate has a signal charge transfer section separated from a photoelectric converting section, so that it is effective in realizing an image pickup apparatus with a high pixel density.

FIG. 4 illustrates the structure of the essential section of such a laminated type CCD image pickup apparatus. N—type buried channel 3 is formed on a p-type Si substrate 1 and on the channel 3 are transfer gate electrodes 6 and 7 formed respectively through gate insulation films $5_1$ and $5_2$, thus constituting a vertical CCD. An n—type source layer 4 for reading out a signal charge of each pixel in buried channel 3 is disposed adjacent to the channel 3 of the vertical CCD. Since n—type source layer 4 is not used as photodiode 23 serving as the photoelectric converting section, it need not have a large area. Such a CCD scan substrate is covered with a first insulation film 8 in which a contact hole 9 is formed, and a relay electrode 11 that has a contact with each source layer 4 is formed in the hole 9. The resultant structure is covered with a second insulation film 12 in which another contact hole 13 is formed and a pixel electrode 14 is formed therein. Then, an undoped a-Si:H film 15 serving as a photoconductive film is disposed on the resultant structure, and a p-type a-SiC:H film 16 serving as a hole preventing layer is further disposed on the film 15, with a transparent electrode 17 being formed on the film 16.

FIGS. 5A-5C illustrate patterns of a unit pixel region of this laminated type CCD image pickup apparatus in correspondence with FIGS. 2A-2C. The area of an opening 19 (see FIGS. 5C, 6C and 7C) determined by pixel electrode 14 is significantly larger than that of a monolithic type structure. With the illustrated structure, since photoconductive film 15 performs photoelectric conversion, that part which is other than the vertical CCD section for transferring a signal charge on the CCD scan substrate can have a small area. This can therefore permit the CCD image pickup apparatus to have such a layout that the area of buried channel 3 is made as large as possible by reducing the area of channel stopper 2, as shown in FIGS. 6A-6C. Accordingly, it is easy to increase the amount of signal charges transferred to 1.5 to 2 times as compared with a monolithic type CCD image pickup apparatus.

In such a laminated type CCD image pickup apparatus, however, reducing the lateral pixel size as shown in FIGS. 7A-7C considerably changes the width of buried channel 3, which adversely influences to signal charge transfer for the following detailed reason.

FIG. 8 illustrates the results of measuring the channel potential (with zero gate voltage) with a change in channel width on a mask of a buried channel MOS transistor. FIG. 9 illustrates the structure of the MOS transistor, with the same numerals as used in FIGS. 1-4 denoting the corresponding sections. As should be obvious from FIG. 8, the channel potential of the buried channel becomes lower with a decrease in the channel width, and it can be hardly called a buried channel in a region with a channel width of less than 1 $\mu$m. This is the so-called narrow channel effect. The measuring results show that, in the laminated CCD with a buried channel as shown in FIGS. 7A-7C, the channel potential at a region having a narrow channel width is low. With the transfer electrodes being arranged as shown in, for example, FIG. 10, the potential distribution at the C—C' cross section would be as illustrated in FIG. 11. More specifically, when the charges are transferred from a second layer transfer gate electrode 7-a to a region under a first layer transfer gate electrode 6, the distribution is as indicated by the one-dot chain line, and when charge transfer is from the electrode 6 to a region under a second transfer gate electrode 7-b, the distribution is as indicated by the broken line. In this state, a potential barrier leaves out some signal charge and the proper image reproduction cannot be provided. With the electrodes arranged as shown in FIG. 12, the potential distribution would be as illustrated in FIG. 13. In this case, incomplete charge transfer also occurs. To prevent such incomplete charge transfer, it is necessary to align the edge portions of first layer transfer gate electrode 6 with the boundaries at which the channel width varies, as shown in FIG. 14. This produces the potential distribution as shown in FIG. 15, which can prevent the aforementioned incomplete charge transfer. With such an electrode arrangement, however, the reverse charge transfer becomes impossible as per the case of two-phase driving structure in which a potential step is formed in one transfer gate electrode. For instance, an overflow drain is provided at the opposite edge of the vertical CCD to the horizontal CCD side, thus making the sweeping of the unnecessary charges impossible by the transfer function in the opposite direction to the transfer direction for reading signal charges.

As described above, according to the conventional laminated type CCD image pickup apparatuses, the narrow channel effect becomes prominent with a reduction in pixel cell size, and, particularly, a channel potential step is formed in one transfer gate electrode to thereby prevent bi-directional charge transfer.

SUMMARY OF THE INVENTION

Accordingly, it is an object of this invention to provide a laminated type solid state image pickup apparatus with a high performance, which overcomes the above problems and ensures a large transfer amount of signal charges making the best use of the substrate area to avoid the narrow channel effect.

To achieve the object, a solid state image pickup apparatus according to this invention comprises:

a semiconductor substrate;

a plurality of buried channels arranged at predetermined intervals in an upper region of the semiconductor substrate, each buried channel being formed in a zigzag pattern with a nearly constant channel width;

transfer electrodes formed through gate insulation films on the channels, respectively;

source layers for individual pixels, disposed adjacent to the channels, respectively, for supplying signal charges of individual pixels to respective buried channels in the upper region of the semiconductor substrate, the source layers being formed in such a pattern that those source layers which are horizontally adjacent to one another are shifted from one another in a vertical direction by a ½ pixel pitch;

first electrode means provided through a first insulation film on the semiconductor substrate provided with the transfer electrodes thereon and in contact with the source layers;

a photoconductive film disposed on the first electrode means; and second electrode means laminated on the photoconductive film.

With the above arrangement, charge reading source layers for adjoining CCDs are shifted by a 1/2 pixel pitch so that it is possible to make the best use of the area on the substrate as buried channels without influenced by the narrow channel effect and to ensure a large transfer amount of signal charges. Further, since the vertical CCD permits a bi-directional charge transfer, it is easy to employ the system for providing an overflow drain on the opposite side of the horizontal CCD to sweep out excess charges. This provides the solid state image pickup apparatus with an electronic shutter function and a blooming restriction function. Furthermore, since the pixel electrodes are arranged in a square grid fashion, signal processing is not complicated and this solid state image pickup apparatus is effective in use for a high-vision camera.

BRIEF DESCRIPTION OF THE DRAWINGS

FIGS. 2A to 2C are layout diagrams emphatically illustrating individual elements of one pixel cell in the structure shown in FIG. 1;

FIGS. 7A to 7C are layout diagrams of the same pixel cell with a reduced layeral size;

FIG. 14 is a diagram illustrating the positional relation between transfer gate electrodes and a channel stopper pattern, which differs from the one shown in FIG. 12;

FIG. 15 is a diagram illustrating the channel potential in the C—C" cross section in the structure shown in FIG. 14;

FIG. 16 is a schematic plan view illustrating the essential section of a laminated type CCD image pickup apparatus according to one embodiment of this invention;

FIG. 17 is a cross-sectional view along the line XVII—XVII of FIG. 16;

FIG. 18 is a cross-sectional view along the line XVIII-XVIII of FIG. 16;

FIG. 23 is a schematic plan view illustrating in shaded lines a pattern of relay electrodes 11 in this embodiment;

FIG. 24 is a schematic plan view illustrating in shaded lines charge reading source layers 4 whose arrangement is corrected in the above embodiment; and FIG. 25 is a schematic plan view illustrating in shaded lines a square grid pattern of pixel electrodes 14 in the above embodiment.

DETAILED DESCRIPTION OF THE PREFERRED EMBODIMENTS

Figure 1:
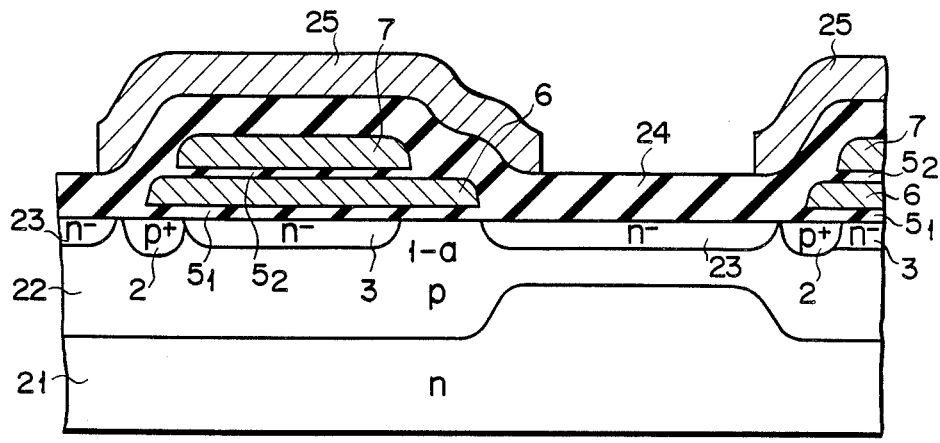
FIG. 1 is a cross-sectional view illustrating the structure of the essential section of a conventional CCD image pickup apparatus.
Figure 3A:
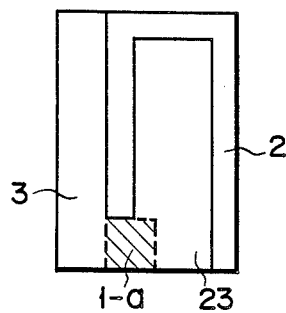
FIGS. 3A to 3C are layout diagrams of the same pixel cell with a reduced lateral size.
Figure 3B:
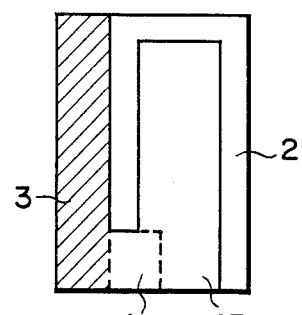
Figure 3C:
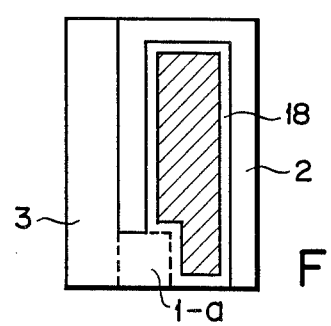
Figure 4:
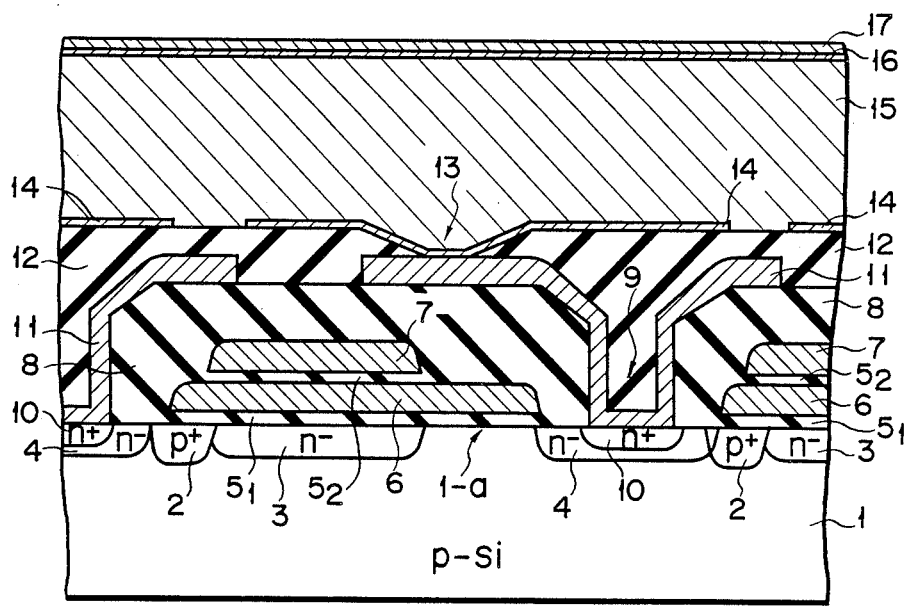
FIG. 4 is a cross-sectional view illustrating the structure of the essential section of a conventional laminated type CCD image pickup apparatus.
Figure 5A:
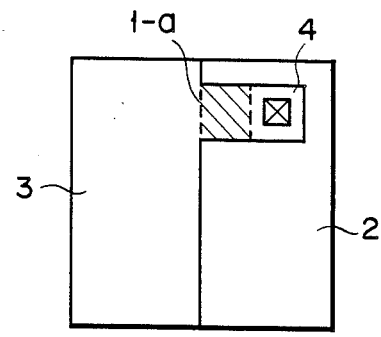
FIGS. 5A to 5C are layout diagrams emphatically illustrating individual elements of one pixel cell in the structure shown in FIG. 4.
Figure 5B:
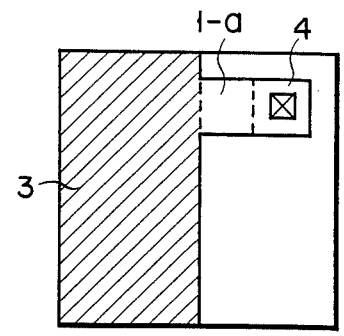
Figure 5C:
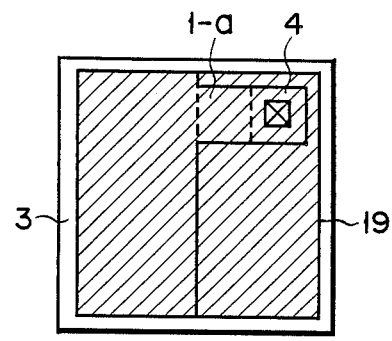
Figure 6A:
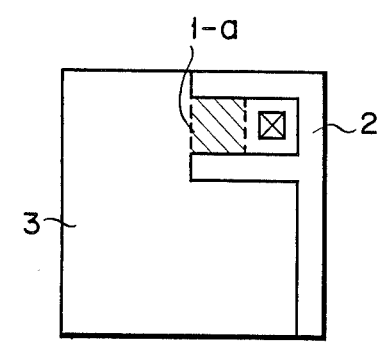
FIGS. 6A to 6c are layout diagrams illustrating the pixel cell with its buried channel chown in FIGS. 5A-5C broadened to the maximum size.
Figure 6B:
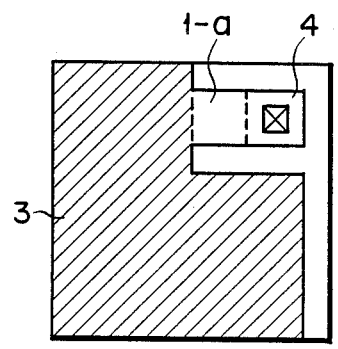
Figure 6C:
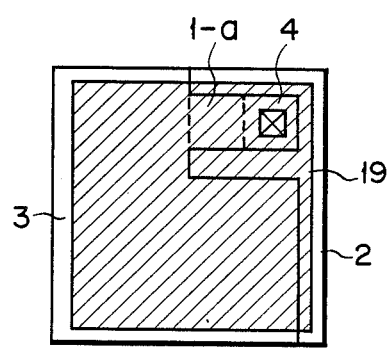
Figure 8:
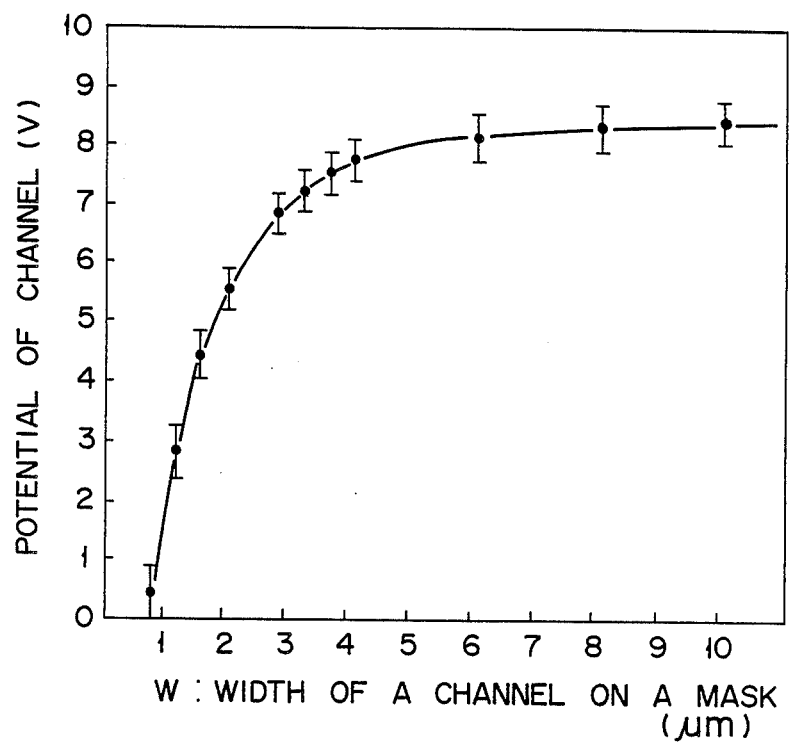
FIG. 8 is a diagram illustrating a measure relation between a channel width on a mask of a buried channel MOS transistor and a channel potential.
Figure 9:
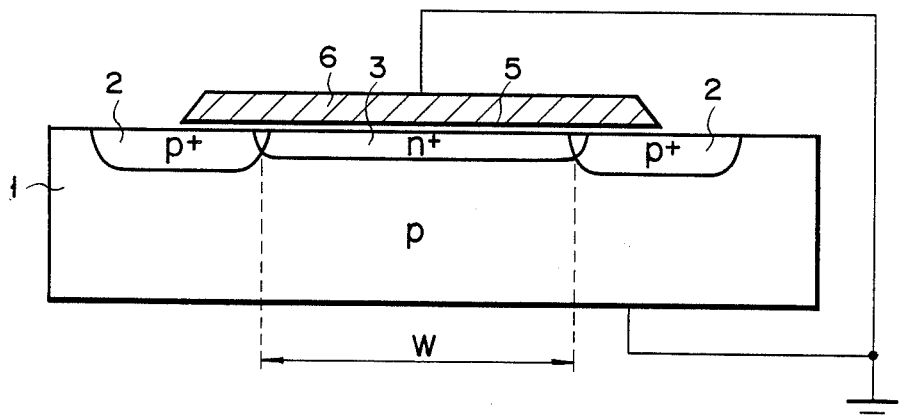
FIG. 9 is a cross-sectional view illustrating the structure of a MOS transistor used for the measurement in FIG. 8.
Figure 10:
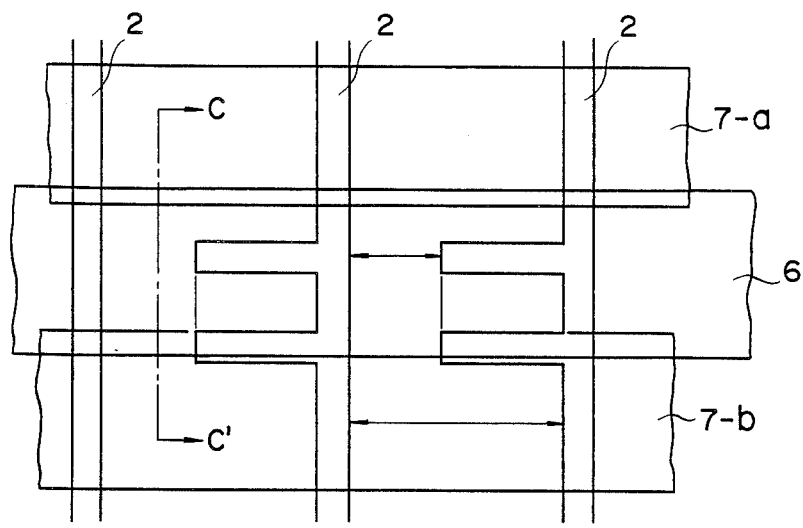
FIG. 10 is a diagram illustrating the positional relation between transfer gate electrodes and a channel stopper pattern as shown in FIG. 4.
Figure 11:
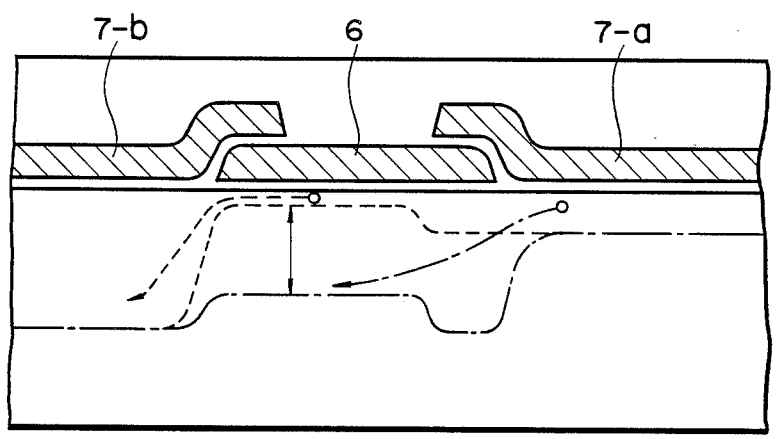
FIG. 11 is a diagram illustrating the channel potential in the C—C cross section in the structure shown in FIG. 10.
Figure 12:
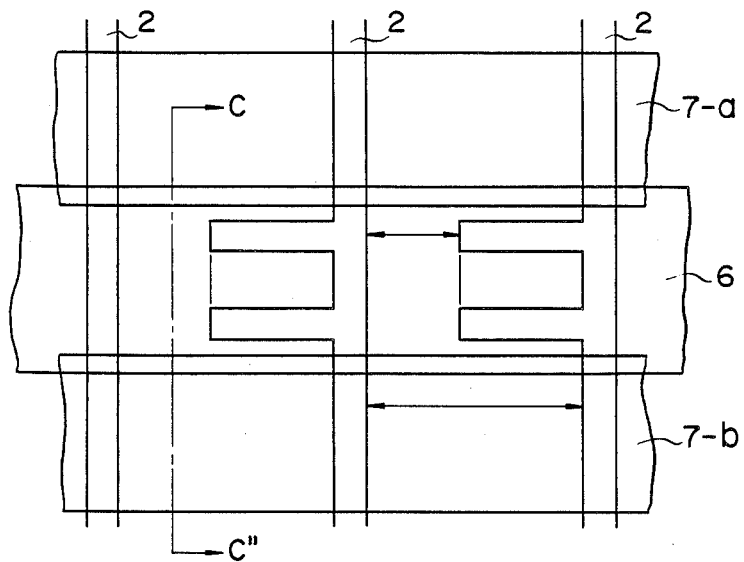
FIG. 12 is a diagram illustrating the positional relation between transfer gate electrodes and a channel stopper pattern, which differs from the one shown in FIG. 10.
Figure 13:
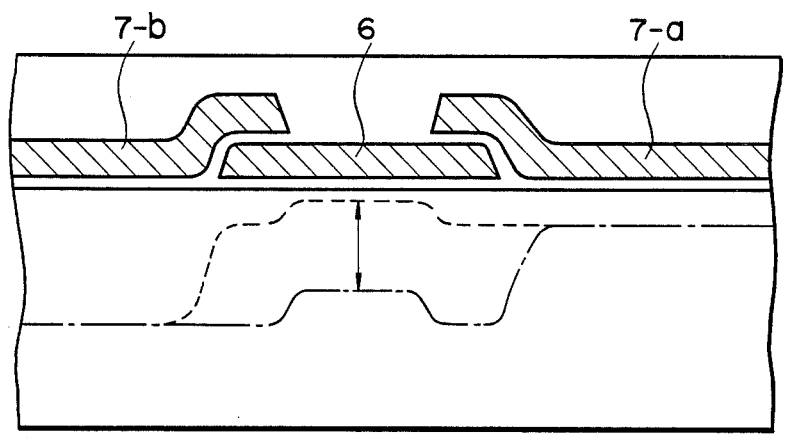
FIG. 13 is a diagram illustrating the channel potential in the C—C' cross section in the structure shown in FIG. 12.

FIG. 16 is a schematic plan view illustrating the essential section of a laminated type CCD image pickup apparatus according to one embodiment of this invention. As its basic structure is the same as the conventional structure as shown in FIG. 4, the same numerals are given to corresponding sections. Although these diagrams only illustrate the structure of a photosensitive section where a vertical CCD array is formed, it is well known that a horizontal CCD is disposed at the edge portion of the vertical CCD. Alternatively, a temporary storage section may be provided between the vertical and horizontal CCDs.

Figure 19:
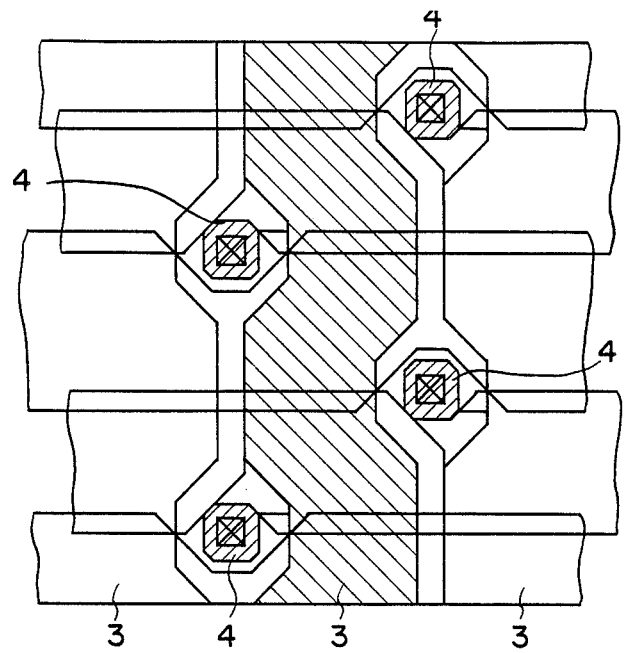
FIG. 19 is a schematic plan view emphatically illustrating a pattern of buried channels of the laminated type CCD image pickup apparatus according to one embodiment.
Figure 20:
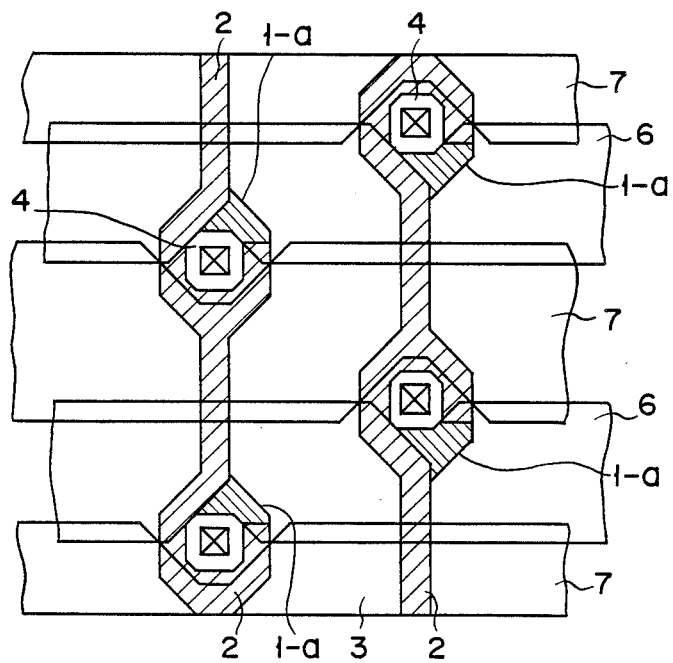
FIG. 20 is a schematic plan view emphatically illustrating a charge transfer section in the same embodiment.
Figure 21:
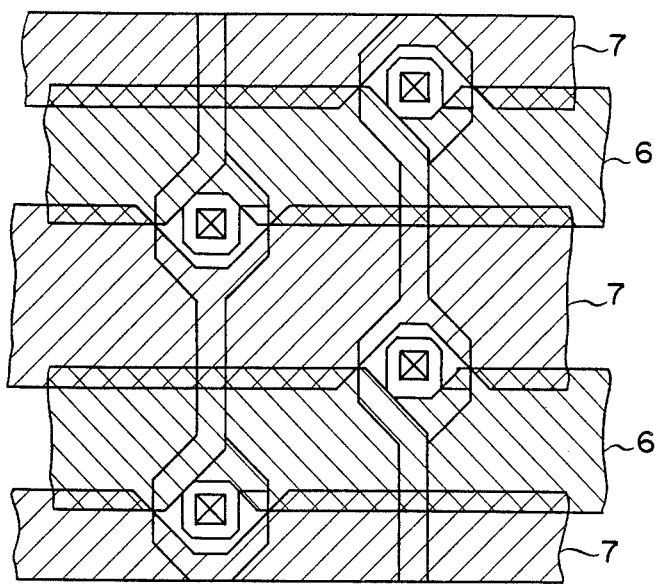
FIG. 21 is a schematic plan view illustrating in shaded lines patterns of transfer gate electrodes 6 and 7 formed by first and second layer polycrystalline silicon films as shown in FIGS. 17 and 18.
Figure 22:
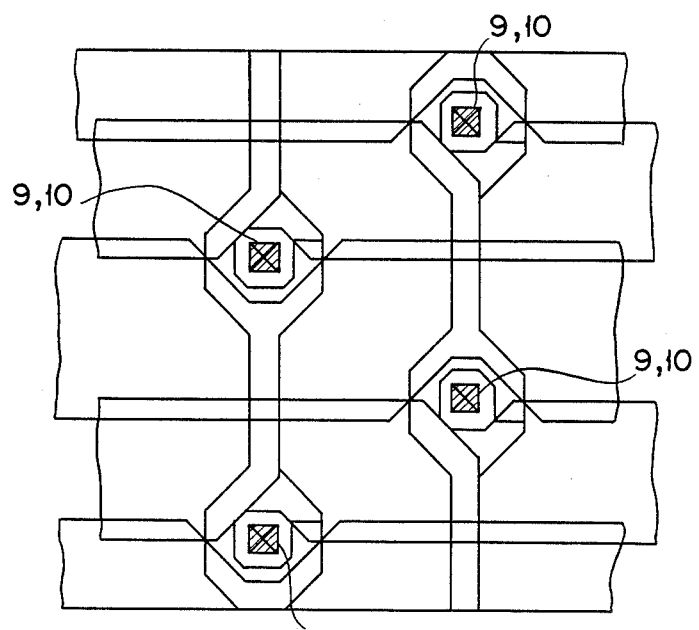
FIG. 22 is a schematic plan view illustrating in shaded lines patterns of contact holes 9 and n+type layers 10 formed in the holes through impurity diffusion in the above embodiment.

In this embodiment, charge reading source layers 4 are vertically shifted every other row by a ½ pixel pitch, as shown in FIG. 4. Accordingly, as indicated by the shaded lines in FIG. 19, buried channesl 3 of the vertical CCD are formed in a zigzag pattern with a nearly constant channel width. FIG. 20 illustrates in shaded lines the transfer sections 1-a that transfer charges to the CCD buried channels. As should be obvious from the diagram, the transfer sections 1-a have such a pattern that the direction of reading out charges differs by 90° every other row. This pattern is necessary to linearly arrange tranfer gate electrodes 6 and 7 as per the conventional apparatus. FIG. 21 illustrates in shaded lines patterns of transfer gate electrodes 6 and 7 respectively formed by the first layer polycrystalline silicon film and the second layer polycrystalline silicon film, and FIG. 22 illustrated in shaded lines contact holes 9 for permitting relay electrodes 11 to be in contact with source layers 4 and n+type layers 10 formed through impurity diffusion in the contact hole regions.

When source layers 4 have the above pattern which is directly reflected on pixel electrodes or the opening pattern, one pixel line would have a zigzag pattern. Accordingly, it is necessary to compensate a deviation in the alignment of openings through some kind of signal processing after signal charges are read out. To compensate for a vertical deviation by a ½ pixel pitch, therefore, read signals should be temporarily stored to be subjected to the deviation compensation usingsignals read out after one horizontal period. This is very inconvenient when the quantity of pixels is significantly large and the speed for signal reading is high as in a highvision solid state image pickup apparatus. According to this embodiment, therefore, the contact hole pattern of pixel electrodes 14 with respect to relay electrodes 11 is specifically designed so as to correct a ½ pixel-pitch deviation in the alignment of source layers 4. That is, as shown by the shaded lines in FIG. 23, the pattern of relay electrodes 11 is pulled out to correct the deviation in alignment of source layers 4 between vertically-arranged adjoiing layer array. And, the pattern of contact holes 13 formed in second insulation film 12 covering relay electrodes 11 is designed as shown by the shaded lines in FIG. 24 to correct the deviation in the arrangement of source layers 4. Consequently, pixel electrodes 14 can have the square grid pattern as indicated by the shaded lines in FIG. 25.

What is claimed is:

1. A solid state image pick up apparatus comprising:
a semiconductor substrate;
a plurality of channels arranged at predetermined intervals in an upper region of said semiconductor substrate, each channel being formed in a zigzag pattern with a nearly constant channel width;
transfer electrodes formed through gate insulation films on said channels, respectively;
source layer sfor individual pixels, disposed adjacent to said channels, respectively, for supplying signal charges of individual pixels to respective channels in said upper region of said semiconductor substrate, said source layers being formed in such a pattern that those source layers which are horizontally adjacent to one another are shited from said channel in a vertical direction by a ½ pixel pitch;
first electrode means arranged on said insulating layer, parts of said first electrode means being in contact with said source layers, respectively;
a photoconductive film disposed on said first electrode means; and
second electrode means laminated on said photoconductive film.

2. A solid state image pick up apparatus comprising:
a semiconductor substrate;
a plurality of buried channels arranged at predetermined intervals in an upper region of said semiconductor substrate, each buried channel being formed in a zigzag pattern with a nearly constant channel width;
transfer electrodes formed through gate insulation films on said buried channels, respectively;
source layers for individual pixels, disposed adjacent to said buried channels, respectively, for supplying signal charges of individual pixels to respective buried channels in said upper region of said semiconductor substrate, said source layers being formed in such a pattern that those source layers which are horizontally adjacent to one another are shifted from said channel in a vertical direction by a ½ pixel pitch;
a first insulating layer formed on said semiconductor substrate and covering said transfer electrode;
relay electrodes arranged on said insulating layer, parts of said relay electrodes being in contact with said source layers, respectively;
a second insulating layer formed on said semiconductor substrate and covering said relay electrodes and said first insulating layer;
a photoconductive film disposed on said pixel electrode; and
transparent electrode provided on said photoconductive film;
whereby said ½ pixel-pitch shift is corrected by selecting said pattern of said pixel electrodes and contact positions of said pixel electrodes with respect to said pattern of said pixel electrodes.

3. The solid state image pick up apparatus according to claim 1 or 2, further comprising a signal charge transfer section provided between each associated pair of said channels and said source layers, said signal charge transfer section changing a direction of reacing out charges from each of said source layers to each of said adjacent layers by 90°.

* * * * *